(12) United States Patent
Finsterbusch et al.

(10) Patent No.: US 9,291,333 B2
(45) Date of Patent: Mar. 22, 2016

(54) ILLUMINATION ARRANGEMENT

(75) Inventors: Klaus Finsterbusch, Berlin (DE);
Tobias Gleitsmann, Michendorf (DE);
Ulrich Hartwig, Berlin (DE)

(73) Assignee: OSRAM GmbH, Munich (DE)

( * ) Notice: Subject to any disclaimer, the term of this patent is extended or adjusted under 35 U.S.C. 154(b) by 293 days.

(21) Appl. No.: 13/995,982

(22) PCT Filed: Dec. 6, 2011

(86) PCT No.: PCT/EP2011/071854
§ 371 (c)(1),
(2), (4) Date: Jul. 10, 2013

(87) PCT Pub. No.: WO2012/084482
PCT Pub. Date: Jun. 28, 2012

(65) Prior Publication Data
US 2013/0294049 A1     Nov. 7, 2013

(30) Foreign Application Priority Data

Dec. 21, 2010   (DE) .................... 10 2010 063 779

(51) Int. Cl.
*F21V 9/16* (2006.01)
*G02B 5/02* (2006.01)
(Continued)

(52) U.S. Cl.
CPC ............... *F21V 9/16* (2013.01); *F21S 48/1145* (2013.01); *G02B 5/0215* (2013.01); *G02B 5/0231* (2013.01); *G02B 5/0278* (2013.01);
(Continued)

(58) Field of Classification Search
CPC ...... F21V 9/16; G02B 5/0215; G02B 5/0231; G02B 5/0278; G02B 5/0284; G02B 5/045; H01S 5/005

USPC .................................................... 362/84, 259
See application file for complete search history.

(56) References Cited

U.S. PATENT DOCUMENTS

| 6,547,423 | B2 | 4/2003 | Marshall et al. | |
| 7,040,774 | B2 * | 5/2006 | Beeson et al. | ......... 362/84 |
| 2005/0145864 | A1 | 7/2005 | Sugiyama et al. | |

FOREIGN PATENT DOCUMENTS

| EP | 1548851 A2 | 6/2005 |
| EP | 1681728 A1 | 7/2006 |

(Continued)

OTHER PUBLICATIONS

Chinese Office Action with English translation dated Oct. 21, 2014 (Invention No. 201180062168).

*Primary Examiner* — Stephen F Husar
(74) *Attorney, Agent, or Firm* — Viering, Jentschura & Partner MBB

(57) ABSTRACT

In various exemplary embodiments, an illumination arrangement is provided, including a light source for providing laser light and a diffusely reflective material and/or a phosphorescent material and/or a fluorescent material, which is arranged on a surface in the illumination arrangement in such a way that light provided by the light source impinges on the material, wherein the surface forms a hollow body having one or more partial surfaces which are arranged in a manner facing one another at least in part in such a way that light reflected or generated by material arranged on one partial surface impinges at least partly on material arranged on the same or another partial surface of the surface, and both the incidence of the laser light and the emission of the reflected or generated light are effected via the same surface of the one or more partial surfaces.

16 Claims, 10 Drawing Sheets

(51) Int. Cl.
*G02B 5/04* (2006.01)
*F21S 8/10* (2006.01)
*H01S 5/00* (2006.01)

(52) U.S. Cl.
CPC .............. *G02B5/0284* (2013.01); *G02B 5/045* (2013.01); *H01S 5/005* (2013.01)

(56) References Cited

FOREIGN PATENT DOCUMENTS

| | | |
|---|---|---|
| JP | 2004516684 | 6/2004 |
| WO | 2005124227 A1 | 12/2005 |

* cited by examiner

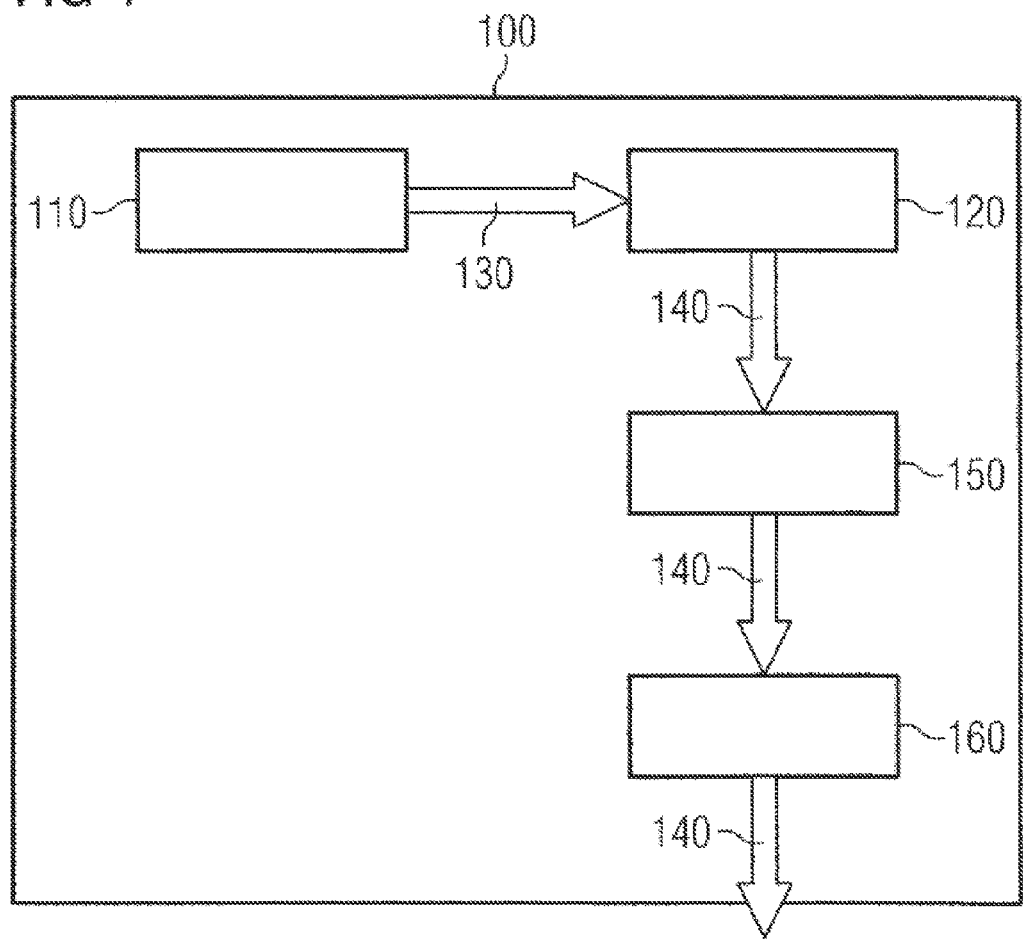

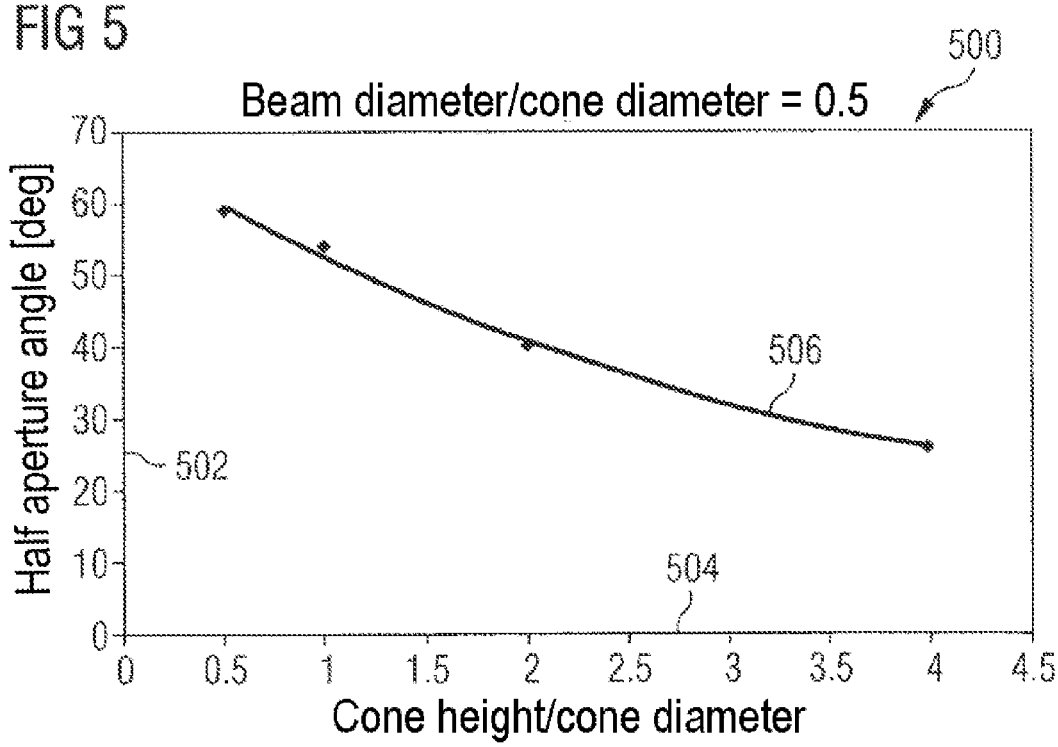
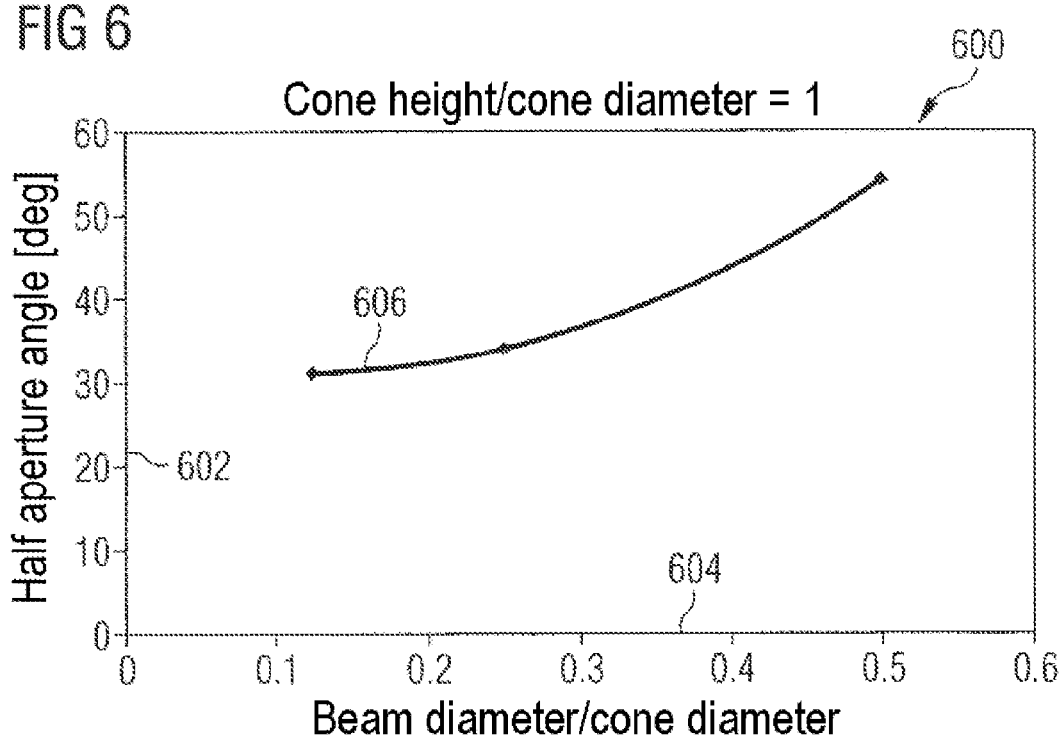

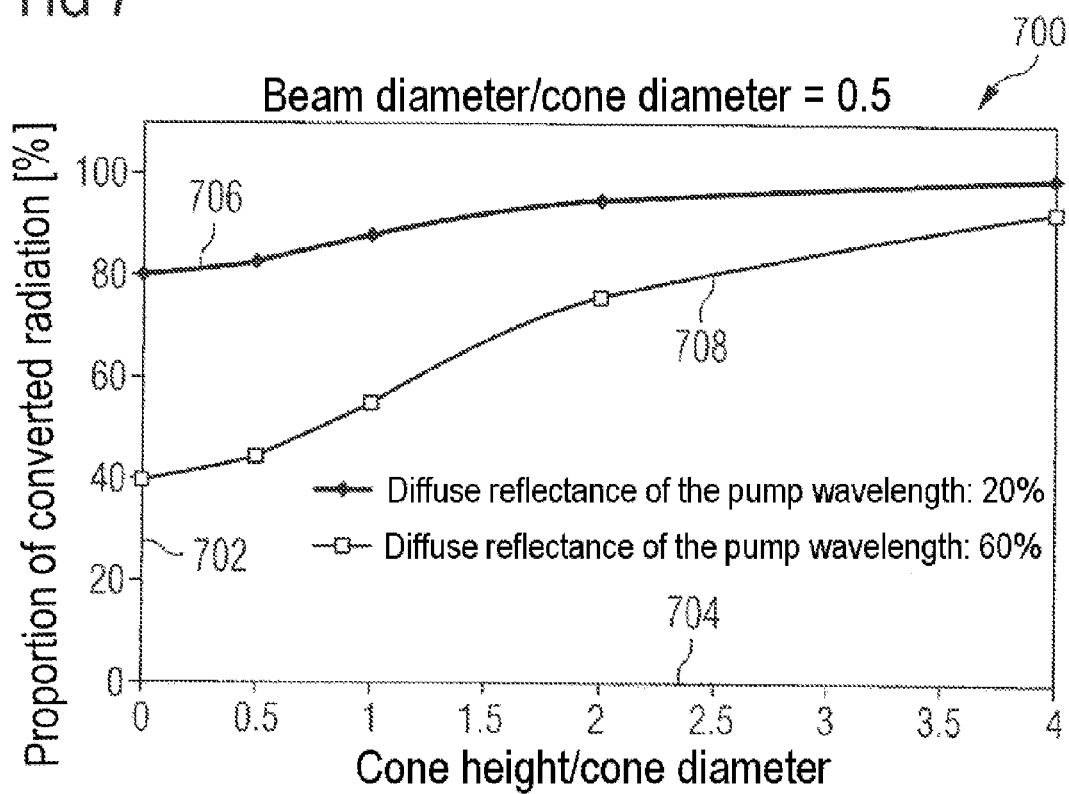

ILLUMINATION ARRANGEMENT

RELATED APPLICATIONS

The present application is a national stage entry according to 35 U.S.C. §371 of PCT application No.: PCT/EP2011/071854 filed on Dec. 6, 2011, which claims priority from German application No.: 10 2010 063 779.3 filed on Dec. 21, 2010.

TECHNICAL FIELD

Various embodiments relate to an illumination arrangement.

BACKGROUND

In a conventional lamp, the light generated by means of an incandescent filament is emitted and is available as useful light. The lamp can have a reflector, by means of which the emitted light can be deflected in such a way that it leaves said reflector as a directional beam and is available as useful light. Lamps on the basis of new kinds of light sources such as LEDs (light emitting diodes) or laser diodes are increasingly gaining in importance nowadays. However, only a limited number of light colors can be generated with these new kinds of light sources. In order to extend this selection, luminophores can be used, which, upon irradiation with light (also designated as pump light) of one color, for their part emit light of a different color, in other words convert light. In this way, white light can be generated for example by irradiating phosphor with blue light.

In the case of light-conversion-based lamps that are customary nowadays, for example a planar phosphor-containing layer is illuminated from below with blue light, which is usually generated by means of LEDs. Here the light is incident perpendicularly to the phosphor-containing layer, which for its part generates white light in accordance with a Lambertian emission characteristic.

With the use of such an arrangement in which a material (or luminophore) that emits light diffusely is irradiated by means of a light source, the light emission from the luminophore takes place substantially in accordance with a Lambertian distribution. That is to say that, in the case of a surface element which is coated with diffusely reflective material and/or a phosphorescent material and/or a fluorescent material and which is illuminated by a light source, light is emitted predominantly perpendicularly to the surface element, wherein the light emission decreases continuously toward the sides.

If such an arrangement is part of an optical system, then this effect just described can have the disadvantage that the converted light possibly does not impinge on an optical unit and, as a result, is lost for further utilization. In general, a targeted variation of the light emission characteristic may be desired, for example a widening of the light distribution in reflector applications, or a narrowing of the light distribution in lens optical units.

Problems can also occur on account of the fact that customary luminophores do not completely convert the incident light, but rather also always diffusely reflect part thereof. Firstly, this scattered light is then no longer available to the conversion process and reduces the degree of conversion. Secondly, the presence of the pump light having a specific color can have a disadvantageous effect in applications where full conversion into a different color is desirable, for example in projection applications, where color fidelity is of fundamental importance.

In the irradiation of luminophores, the limitation is furthermore present that said luminophores cannot be irradiated with arbitrary pump light powers. Excessively high power densities on the luminophore can impair the functioning thereof or even damage the luminophore.

SUMMARY

Therefore, various embodiments provide an illumination arrangement including a material which emits light diffusely, which illumination arrangement solves the problems mentioned, wherein, in particular, it has an adjustable emission characteristic and an improved efficiency and can be operated with higher pump power densities.

In various exemplary embodiments, an illumination arrangement is provided, including a light source for providing laser light and a diffusely reflective material and/or a phosphorescent material and/or a fluorescent material, which is arranged on a surface in the illumination arrangement in such a way that laser light provided by the light source impinges on the material, wherein the surface forms a hollow body open at least on one side (in this connection it should be noted that, in the context of this description, by way of example, a groove described below should also be understood as a hollow body) having one or more partial surfaces which are arranged in a manner facing one another at least in part in such a way that light reflected or generated by material arranged on one partial surface impinges at least partly on material arranged on the same or another partial surface of the surface, and both the incidence of the laser light on the material and the emission of the reflected or generated light from the material are effected via the same surface of the one or more partial surfaces. It should be pointed out that the partial surfaces need not necessarily be physically connected to one another.

They can also be formed by individual separate elements. In various exemplary embodiments, the elements can be carried by a common carrier or a plurality of carriers. An interspace can be provided between the partial surfaces. Furthermore, the partial surfaces need not necessarily be completely covered with a diffusely reflective material and/or a phosphorescent material and/or a fluorescent material. A partial covering or coating of the partial surface(s) with a diffusely reflective material and/or a phosphorescent material and/or a fluorescent material.

To put it another way, in an illumination arrangement in accordance with various exemplary embodiments, the partial surfaces bearing a diffusely reflective material and/or a phosphorescent material and/or a fluorescent material are partly tilted relative to the light path of the laser light provided by the light source. What can be achieved as a result, firstly, is that the illumination arrangement has an emission characteristic that differs from a Lambertian emission characteristic. By adapting the geometry of the illumination arrangement, it is possible to adapt the emerging light distribution to the respective requirements of the use environment. Secondly, as a result, the proportion of converted radiation can also be set, which will be explained in greater detail below. To put it more precisely, it is advantageously possible to increase the ratio of converted light to remaining pump or laser light and thus to improve the proportion of converted light. The geometrical configuration of the illumination arrangement can result in an enlargement of the surface area illuminated with the laser light from the light source relative to the effective surface area that emits the converted light. In accordance with the exemplary embodiments, the pump or laser light is incident on the partial surfaces with the material applied thereto through a region, for example a plane, which is delimited by the upper edges of the one or more partial surfaces arranged in a manner facing one another at least in part. Said region hereinafter is called base surface and it is also the region that emits converted light effectively. Clearly, the base surface is a virtual light coupling-in and coupling-out opening which itself does not constitute a physical surface and, in the case of the example of a pyramid form, corresponds to the base surface thereof, the base surface also not being covered with luminophore.

As a result, an illumination arrangement may advantageously be operated with high radiances of, for example, several watts per square millimeter, without the material that emits light diffusely being impaired in terms of its functioning or even destroyed.

Depending on the embodiment, the surface normal vector can point to a vector component that is parallel to the light path.

In accordance with various embodiments of the illumination arrangement, the material arranged on the partial surface or partial surfaces may include a mixture of different luminophore mixtures. Such an embodiment is particularly preferred if mixing of the conversion light is desirable. In this case, each luminophore mixture can generate a converted light having a different wavelength. The different luminophore mixtures can be distributed homogeneously on the partial surfaces or else be present in a manner spatially separated thereon. By way of example, in this case, one of the luminophore mixtures can be an alkali metal silicate-phosphor mixture.

In various exemplary embodiments, the aperture angle of the light generated by the illumination arrangement can be set by means of the choice of the angles of the partial surfaces with respect to one another. As a result, a simple way of setting the emission characteristic of the illumination arrangement is provided via the setting of the geometry of the illumination arrangement.

By way of example, the surface on which the reflective and/or phosphorescent and/or fluorescent material is arranged forms a lateral surface of a cone or a lateral surface of a pyramid.

Alternatively, provision can also be made of an embodiment in which the surface on which the reflective and/or phosphorescent and/or fluorescent material is arranged defines a groove. The groove can furthermore be embodied as straight or curved.

In accordance with one embodiment of this disclosure, a light path of the laser light provided can run parallel to an axis of symmetry of the illumination arrangement. Alternatively, however, the light path can also run in a manner tilted relative to an axis of symmetry of the illumination arrangement. This has the consequence, inter alia, that the illumination arrangement is not susceptible to slight misalignments between the planned light path of the laser light provided and the surface bearing the material that emits light diffusely, which advantageously facilitates manufacture.

In one configuration, the light source of the illumination arrangement is designed in such a way that the laser light provided includes at least one laser beam, wherein the laser beams can have different wavelengths and their beam paths can be independent of one another.

In accordance with another configuration, the illumination arrangement may include at least one collimation optical unit designed for restricting an angle at which the light emitted diffusely by the material leaves the illumination arrangement.

As a result, the light distribution of the illumination arrangement can be further adapted and possible losses can be reduced. The collimation optical unit can be, for example, at least one lens and/or at least one TIR (total internal reflection) element.

In accordance with a further embodiment, the illumination arrangement can be embodied in such a way that the surface on which diffusely reflective material and/or a phosphorescent material and/or a fluorescent material is arranged in the illumination arrangement has a plurality of one or more partial surfaces which are arranged adjacent to one another and are formed on hollow bodies arranged adjacent to one another and are arranged in a manner facing one another at least in part in such a way that light reflected or generated by material arranged on one partial surface of one hollow body impinges at least partly on material arranged on the same or another partial surface of the surface of the same hollow body, and both the incidence of the laser light on the material and the emission of the reflected or generated light from the material are effected via the same surface of the one or more partial surfaces. This has the advantage that a larger surface bearing the material, including or consisting of the partial surface(s), can be provided without this taking up an excessive amount of space substantially in a direction perpendicular to a plane in which the hollow bodies are arranged adjacent to one another.

In one configuration, the illumination arrangement may furthermore include a reflector, wherein the surface on which the reflective and/or phosphorescent and/or fluorescent material is arranged is arranged at least partly in the reflector, in particular at least partly at the focal point of the reflector. This embodiment is distinguished by the fact that light losses from the reflector that are governed by geometrical factors can be reduced.

The illumination arrangement can be designed for example as a projector lamp, for example a video projector lamp, an effect lighting lamp or a lamp in the area of optical waveguides (for example in the area of endoscopy), but is not restricted to these types.

In various exemplary embodiments, an illumination arrangement is provided. The illumination arrangement may include a light source for providing laser light; and a diffusely reflective material and/or a phosphorescent material and/or a fluorescent material, which is arranged on a surface in the illumination arrangement in such a way that laser light provided by the light source impinges on the material, wherein the surface forms a hollow body having one or more partial surfaces which are arranged in a manner facing one another at least in part, wherein the laser light is incident through a region which is delimited by the upper edges of the one or more partial surfaces arranged in a manner facing one another at least in part.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIG. 1 shows a schematic construction of an illumination arrangement in accordance with various exemplary embodiments;

FIGS. 5 and 6 show simulation results concerning the emission characteristic of various exemplary embodiments;

FIG. 7 shows simulation results concerning the degree of conversion of various exemplary embodiments;

FIGS. 8A and 8B show a surface which emits light diffusely with a groove form in accordance with various exemplary embodiments, wherein FIG. 8A illustrates an exemplary embodiment with a straight groove and FIG. 8B illustrates an exemplary embodiment with a curved groove;

FIGS. 9A and 9B show a surface which emits light diffusely with a groove form in accordance with various exemplary embodiments, wherein FIG. 9A illustrates an exemplary embodiment with a straight groove and FIG. 9B illustrates an exemplary embodiment with a curved groove;

DETAILED DESCRIPTION

Figure 2A:
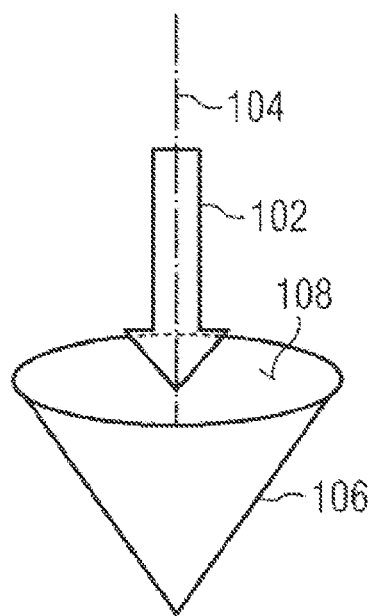
FIGS. 2A and 2B show exemplary embodiments of different surfaces which emit light diffusely and which are embodied as a lateral surface of a cone (FIG. 2A) and a lateral surface of a pyramid (FIG. 2B)

In the following detailed description, reference is made to the accompanying drawings, which form part of this description and show, for illustration purposes, specific embodiments in which this disclosure can be implemented. In this regard, direction terminology such as, for instance, "at the top", "at the bottom", "at the front", "at the back", "front", "rear" etc. is used with reference to the orientation of the figure(s) described. Since components of embodiments can be positioned in a number of different orientations, the direction terminology serves for illustration purposes and is not restrictive in any way at all. It goes without saying that other embodiments can be used and structural or logical amendments can be made, without departing from the scope of protection of this disclosure. It goes without saying that the features of the different exemplary embodiments described herein can be combined with one another, unless specifically indicated otherwise. The following detailed description should therefore not be interpreted in a restrictive sense, and the scope of protection of this disclosure is defined by the appended claims.

In the context of this description, the terms "connected" and "coupled" are used to describe both a direct and an indirect connection and a direct or indirect coupling. In the figures, identical or similar elements are provided with identical reference signs, in so far as this is expedient.

FIG. 1 illustrates a schematic construction of an illumination arrangement 100 in accordance with various exemplary embodiments.

The illumination arrangement 100 may include a light source 110 and a conversion arrangement 120. The laser light 130 provided by the light source 110 is fed to the conversion arrangement 120 and converted by the latter to form a converted light 140. Before emerging from the illumination arrangement 100, the converted light 140 can pass through one (or a plurality of) collimation optical unit(s) 150 and/or impinge on a reflector 160, with the aid of which the outputting of the converted light 140 can be adapted further. The order of the collimation optical unit(s) 150 and of the reflector 160 is arbitrary. However, the converted light 140 can also be output from the illumination arrangement 100 directly by the conversion arrangement 120.

The light source 110 can be designed in such a way that the laser light provided has at least one laser beam and/or at least one laser diode beam. Consequently, in various exemplary embodiments, the light source 110 can be designed as laser and/or as laser diode or semiconductor laser or include such. In the case where more than one laser beam 130 is present, the laser beams 130 can have the same wavelength, as a result of which, for example, the power of the laser light provided can advantageously be increased. Alternatively, the laser beams 130 can also have two or more different wavelengths. In various exemplary embodiments, the light source 110 can be divided into a plurality of parts, for example a light-generating part and a light-directing or light-guiding part. Thus, by way of example, the light source 110 may also include only a light-directing or light-guiding part and the generation of light can take place outside the illumination arrangement 100 for example outside a housing of the illumination arrangement 100. The light source 110 can be spatially concentrated or alternatively spatially distributed. In various exemplary embodiments, it can be formed by one or more optical waveguides and/or one or more light-transmissive regions and/or one or more openings in, for example, a housing of the illumination arrangement 100, wherein the laser light can be divided between the spatially distributed light source 110 in any desired manner. The laser light beams 130 of the spatially distributed light source 110 can run independently of one another and impinge on the conversion arrangement 120 at different angles. The at least one laser beam 130 provided can be focused or collimated. A cross section of the at least one laser beam can be larger or smaller than the base surface of the conversion arrangement 120. The cross section of the at least one laser beam 130 can be for example in a range of approximately 1 mm$^2$ to approximately 10 mm$^2$, for example in a range of approximately 1 mm$^2$ to approximately 4 mm$^2$, for example in a range of approximately 1 mm$^2$ to approximately 2 mm$^2$.

In various exemplary embodiments, the conversion arrangement 120 has a surface 108 on which an arbitrary diffusely reflective material and/or an arbitrary phosphorescent material and/or an arbitrary fluorescent material is arranged, on which the laser light 130 impinges. The surface 108 forms a hollow body having a plurality of partial surfaces which are arranged in a manner facing one another at least in part in such a way that light reflected or generated by material arranged on one partial surface impinges at least partly on material arranged on another partial surface of the surface 108. Alternatively, the surface 108 can have a plurality of partial surfaces arranged adjacent to one another and formed on hollow bodies arranged adjacent to one another. The conversion arrangement at all events has the base surface through which the pump or laser light 130 is fed to the partial surfaces of a hollow body. The base surface is the surface through which the converted light 140 also leaves a hollow body, that is to say that it is analogously the surface that emits the converted light effectively. To put it another way, this means that the incidence of the laser light 130 and also the emission of the reflected or generated light 140 by the material are effected via the same surface of the partial surfaces. In a conversion arrangement 130 having a plurality of hollow bodies, the base surface corresponds to a combination of the individual base surfaces. The partial surfaces of the surface 108 can be in direct contact with one another or alternatively be connected to one another by a carrier material or holding material. Furthermore, the material arranged on the surface 108 may include a mixture of different diffusely reflective materials and/or phosphorescent materials and/or arbitrary fluorescent materials. As a result, a conversion of the pump or laser light 130 into a desired color mixture can be provided. The laser light 130 is converted by the material that emits light diffusely on the conversion arrangement 120 and leaves the latter as converted light 140. Conversion of the light can be understood to mean the conversion of the laser light 130 by fluorescence or phosphorescence, for example, or alternatively by reflection or scattering. Depending on the underlying conversion mechanism, the wavelengths of the pump light 130 and the converted light 140 can be identical or different. The light conversion may be based exclusively on one mechanism or alternatively include a combination of the conversion mechanisms.

An explanation is given below of how the various exemplary embodiments of the conversion arrangement 120 can be produced. Production is based on the insight that suspensions of solid luminophore particles in liquid aqueous alkali metal silicate solutions are suitable for forming mechanically stable, hard luminophore layers which at the same time have very good optical properties.

The method for producing a luminophore layer or a luminophore body includes the following steps:
  applying a suspension containing at least one solid luminophore and at least one alkali metal silicate to a substrate surface or into a mold in order to produce a luminophore layer or a luminophore body;
  curing the luminophore layer or the luminophore body.

The suspension can be an aqueous suspension and contain a mixture of water and at least one liquid alkali metal silicate. Furthermore, a suitable suspension can also be produced by suspending the solid luminophore in a liquid solution containing alkali metal silicate.

For producing the suspension, it is possible to admix the luminophore powders with liquid aqueous alkali metal silicate. In this case, the ratio of the volumes of alkali metal water glass proportion, water and solid powder directly influences the homogeneity of the suspension (processability), the viscosity, the resulting layer thickness, the cracking tendency, the drying behavior and the optical properties of the resulting layer (later glass proportion).

It has proved to be advantageous if the volume concentration ratio of liquid alkali metal silicate and water in such mixtures is from approximately 1:5 to approximately 5:1, preferably from approximately 1:3 to 3:1. In specific embodiments of the conversion arrangement 120, during production the volume concentration ratio of liquid alkali metal silicate(s) and water is therefore 1:3, 1:2, 2:3, 1:1, 2:1, 3:2 or 3:1. The ratio used can be chosen depending on the target properties of the colorant layer (e.g. glass proportion, layer thickness, strength), and on the luminophores themselves. A proportion of pure alkali metal silicate above the abovementioned concentration range leads to the foaming of the layer during drying or baking. In this connection, "approximately" means that the corresponding numerical value can deviate by about 10% upward or downward. In one embodiment of production, the liquid alkali metal silicate is a saturated solution of alkali metal silicate in water, which is then further diluted with water in a ratio mentioned above. Such a saturated solution can contain for example 7.5-8.5% by weight of alkali metal oxide, e.g. $Na_2O$, and 25.5-28.5% by weight of $SiO_2$ (in each case determined by acidimetry). Such a solution can have a density of approximately 1.296 to approximately 1.396 g/ml. The at least one alkali metal silicate can be, for example, sodium silicate or potassium silicate. Mixtures of the abovementioned alkali metal silicates are likewise encompassed. The alkali metal silicates are compounds of the general formula $M_2O \cdot n\, SiO_2$, where M is an alkali metal and n is in the range of 1-4. In various embodiments of the conversion arrangement 120, during production the alkali metal silicates are used as colloidal, alkaline solutions in water, in particular sodium/potassium silicate solutions. Such aqueous solutions can be produced by dissolving the solid alkali metal silicates in water at elevated temperature and elevated pressure.

The at least one solid luminophore can also be a mixture of two or more different luminophores. In this connection, the expression "at least one" means one or more, in particular at least 2, 3, 4, 5, 6, 7, 8, 9, 10 or more. The production described here therefore also relates to suspensions containing two or more, for example 2, 3 or 4, different luminophores. The solid luminophore is usually used as powder. The suspension can be produced, for example, by the solid luminophore being added to a mixture of water and alkali metal silicate. Suitable luminophores are known in the prior art. Customary luminophores are, for example, silicates, nitrides, oxides, phosphates, borates, oxynitrides, sulfides, selenides, and halides of aluminum, silicon, magnesium, calcium, barium, strontium, zinc, cadmium, manganese, indium, other transition metals, or rare earth metals such as yttrium, gadolinium or lanthanum, which are doped with an activator, such as, for example, copper, silver, aluminum, manganese, zinc, tin, lead, cerium, terbium, titanium, antimony or europium. In various embodiments of the conversion arrangement, the luminophore is an oxidic or (oxy)nitridic luminophore, such as a garnet, orthosilicate, nitrido(alumno)silicate or nitridoorthosilicate, or a halide or halophosphate. Concrete examples of suitable luminophores are strontium chloroapatite:Eu $((Sr,Ca)_5(PO_4)_3Cl:Eu;$ SCAP), yttrium aluminum garnet:cerium (YAG:Ce) or $CaAlSiN_3$:Eu.

In various embodiments of the conversion arrangement 120, the mass ratio of luminophore or luminophore mixture to the aqueous, liquid alkali metal silicate, i.e. the mixture of alkali metal silicate and water, is therefore from approximately 1:5 to approximately 5:1, preferably from approximately 1:3 to 3:1. Exemplary concentration ratios are therefore 3:1, 2:1, 1:1, 1:2 or 1:3. These concentration ratios have proved to be particularly favorably processable with regard to the homogeneity of the suspension, sedimentation time and layer thickness.

In accordance with various embodiments of the conversion arrangement 120, the suspension can furthermore contain further constituents, for example particles having light-scattering properties and/or auxiliaries. Examples of auxiliaries include surfactants and organic solvents. Examples of light-scattering particles are gold, silver and metal oxide particles.

During production, the application of the suspension to a surface or introduction into a mold can be effected by elutriation, printing, spraying or injection. In order to produce a luminophore layer, application can furthermore include spinning and/or an ultrasound treatment.

The substrate to which the luminophore layer is applied can be for example a heat sink or optical component, such as a collimator, for example. The substrate can consist of various suitable materials, such as e.g. plastic, glass, ceramic or metal. In order to form a luminophore body, it is possible to use molds composed of the materials mentioned. The luminophore body can be a luminophore film, for example.

The curing of the luminophore layer or of the luminophore body can be effected by drying. The curing or drying can be effected at room temperature or at elevated temperature, for example 80-150° C. Different curing/drying steps at different temperatures can also be combined with one another. A drying step at room temperature can be followed by a further drying step at elevated temperature, for example 80 to 150° C. The curing/drying at elevated temperature can be effected in a furnace, for example. Alternatively, the substrate or the mold and/or the luminophore layer/luminophore body can be heated by means of microwaves or induction techniques. During the production of a luminophore body, the latter can be released from the mold after a first drying step and then, optionally at elevated temperature, be dried further.

Depending on the luminophore used, the curing/drying can also be effected under a protective gas (e.g. $N_2$ or Ar) or in a vacuum. It is thereby possible to avoid an inactivation of the luminophore as a result of the action of oxygen at elevated temperature.

One luminophore layer can be obtained for example by producing a suspension of YAG:Ce as luminophore in a liquid alkali metal silicate-water mixture (1:1) in a ratio of luminophore to alkali metal silicate-water mixture of 1:3, application to a substrate, drying at room temperature for 15-30 minutes and curing in a furnace for approximately 1 h at 80° C. and then for approximately 1 h at 220° C.

Another luminophore layer can be obtained for example by producing a suspension of nitridoorthosilicate as luminophore in a liquid alkali metal silicate-water mixture (1:1) in a ratio of luminophore to alkali metal silicate-water mixture of 2:3, application to a substrate, drying at room temperature for 15-30 minutes and curing in a furnace for approximately 1 h at 80° C. and then for 2-3 h at 150° C.

By binding luminophores using alkali metal silicates, it is possible to produce very hard, mechanically stable luminophore layers whose binder in the case of many luminophores in the range of their operating temperature does not interact with the luminophores, is optically transparent and spectrally and thermally stable. It is thus possible to produce both thin luminophore layers on substrate surfaces having layer thicknesses of between 50 and 200 µm, and unbound luminophore laminae or three-dimensional bodies (optical components) having a larger extent (a few mm).

The luminophore layers with luminophore particles can be used in transmission with a transparent substrate or in reflection with an optically dense substrate. Furthermore, the luminophore layer can be directly bound to the optical unit between a transparent component, for example an optical component, and a heat sink.

In order that the conversion of excitation light into emitted light is configured as efficiently as possible, the stray light proportion of the excitation light must be minimized as much as possible. This can be done for example by light coupling to luminophore particles that are as large as possible. In principle, by means of corresponding processing processes (grinding), the particle sizes of the luminophores can be set and selected in a certain range. In practice, however, grain size distributions are always present. Within suspensions, the larger and heavier particles sediment first, and the smaller and lighter particles later, with the result that after a certain time (inter alia depending on viscosity of the liquid and particle sizes) a gravitational force driven particle size distribution is established (small particles at the upper layer surface, larger particles at the bottom). The aqueous alkali metal silicate solution can be utilized for example to the effect that a particle size distribution is set during application and curing by single or repeated rotation of the substrate. Alternatively or additionally, the particle size distribution can be set using a centrifuge. The luminophore layer with the luminophore particles can then be detached from the carrier medium after drying and baking, rotated by 180° and applied to a substrate again with the optically more favorable coarser grain distribution toward the top, e.g. by adhesive bonding with alkali metal silicate.

Alternatively, the particle distribution can be influenced by an ultrasound treatment. In this case, by way of example, coarser luminophore particles can be shaken to the layer surface by means of ultrasound.

Furthermore, the suspension may include a liquid aqueous alkali metal silicate and one or more solid luminophores. The volume concentration ratio of liquid alkali metal silicate and the mass ratio of liquid alkali metal silicate-water mixture and luminophore (mixture) can in this case be as specified above in connection with the production method. In this case, alkali metal silicate and luminophore can likewise be as defined above.

The suspension can furthermore contain further constituents, such as, for example, particles having light-scattering properties or auxiliaries.

The luminophore layers described here are mechanically and thermally very stable owing to the use of alkali metal silicate as thermally, chemically inert and spectrally stable binder and can increase the power densities of the excitation light. Furthermore, they are distinguished by good optical properties.

The use of alkali metal silicate as binder furthermore makes it possible to improve the optical linking to the surroundings (immersion) since light coupling-in or coupling-out or emission characteristic (lens effect) can be influenced by the shaping of the luminophore layer (e.g. during production by the use of molds or subsequent mechanical processing).

The luminophore layers produced by means of the production described can be used in reflection or in transmission depending on the ratio of alkali metal silicate and luminophore proportion. Furthermore, a direct optical linking to the optical elements is possible. Production is comparatively simple and, on account of the low processing temperatures, is largely independent of the substrate material (metals, glasses, ceramics, plastics).

The low viscosity of the suspension liquid furthermore allows the influencing of the grain size distribution at the luminophore surface, for example by the gravitational force or ultrasound driven particle selection.

For further improvement of the optical properties of the luminophore layers, it is furthermore possible to employ methods for coating optical glasses (e.g. antireflection coating, dichroic or filter layers).

The high hardness and very good mechanical stability of the luminophore layers produced in ways described allow more freedoms in the design of luminophore-based products, e.g. higher power densities during luminophore excitation and static variants (dispensing with color wheel solutions), the production of substrate-independent luminophore laminae or films which can be used in a self-supporting manner or can subsequently be adhesively bonded onto substrates (e.g. with alkali metal silicate), the production of three-dimensional structures and bodies, e.g. optical components.

Furthermore, the luminophore layers or luminophore bodies described can be mechanically reworked. Thus, by way of example, the luminophore surface can be structured, e.g.

provided with holes or grooves, or the surface can be roughened in a targeted manner. That leads to more effective heat dissipation and reduction of the power densities as a result of the surface area being enlarged.

In this case, by way of example, self-supporting variants for cooling the luminophore underside or active cooling by means of grooves or wing structures in a luminophore layer are conceivable.

In accordance with various exemplary embodiments of the conversion arrangement 120, the surface 108 can contain one or more alkali metal silicate-phosphor mixtures. The luminophore, such as phosphor, for example, can be embedded into a silicone layer. Furthermore, the phosphor can be applied to the surface (108), which in this case contains a conductive material, by means of EPD (electrophoretic deposition).

Figure 2B:
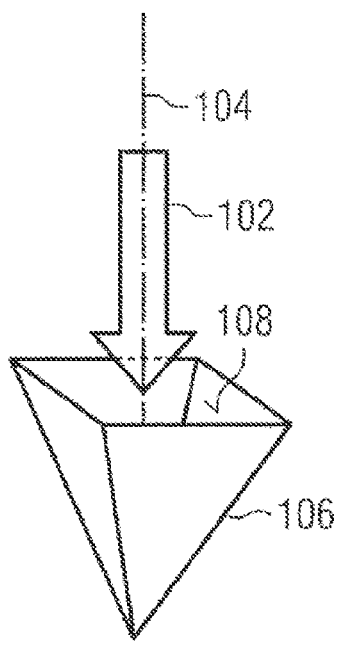

FIG. 2A and FIG. 2B illustrate different exemplary embodiments of the conversion arrangement 120.

Both exemplary embodiments include a hollow body 106 having a base surface and a lateral surface, wherein the lateral surface tapers, for example to a point, on the side opposite the base surface. In different exemplary embodiments, the arrow identifies the direction of incidence of the pump light 102, which is provided by the light source 110 (not illustrated) of the illumination arrangement 100 along a light path. The laser light 130 impinges on a lateral inner surface 108 of the hollow body 106, to which surface the material that emits light diffusely is applied.

In the exemplary embodiment illustrated in FIG. 2B, the hollow body has a pyramid shape having a square base surface. This exemplary embodiment thus includes four triangular partial surfaces. In the exemplary embodiment of the conversion arrangement illustrated in FIG. 2A, the hollow body 106 has a cone shape, i.e. the base surface is circular. This exemplary embodiment is a limiting case of the pyramidal hollow body in FIG. 2B which includes to an approximation an infinite number of arbitrarily small partial surfaces in the form of isosceles triangles which in each case are arranged with their shorter sides next to one another along a circle and are tilted toward the center of the circle and thus form the lateral surface of the cone. In both exemplary embodiments, the laser light 130 is incident from above (as seen from the point of view in FIG. 2A and FIG. 2B), along the axis 104 of symmetry of both hollow bodies 106 or perpendicularly to the base surface of the hollow bodies 106. Exemplary embodiments of the hollow bodies 106 to which no axis of symmetry can be assigned are also conceivable. In those cases, however, it would still be possible to talk of light incidence perpendicular to the base surface of the hollow body 106. Alternatively, the base surface of the hollow body illustrated in FIG. 2B can have a triangular or else hexagonal shape. The exemplary embodiments of the conversion arrangement shown in FIG. 2A and FIG. 2B are also designated as "0-dimensional" since the structure thereof is repeated neither along a line nor on an area. The areas of the base surfaces of the exemplary embodiments of the conversion arrangement shown in FIG. 2A and in FIG. 2B can be for example in a range of approximately 1 $mm^2$ to approximately 10 $mm^2$, for example in a range of approximately 1 $mm^2$ to approximately 5 $mm^2$, for example in a range of approximately 1 $mm^2$ to approximately 2 $mm^2$.

Figure 3:
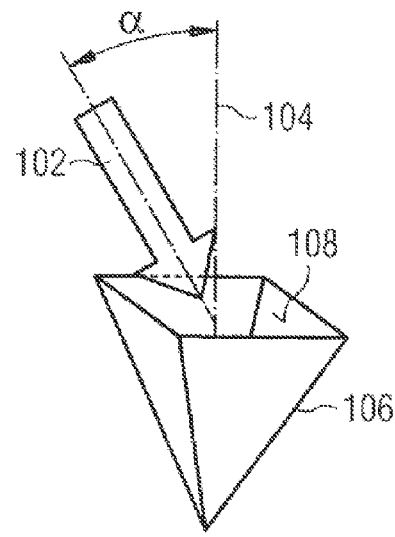
FIG. 3 shows an exemplary embodiment of a surface which emits light diffusely, this exemplary embodiment being pumped at a predefined angle $\alpha$.

The direction of incidence of the pump light 102 can, however, also be tilted by an angle α relative to the axis 104 of symmetry of a hollow body 106 or be non-perpendicular to the base surface of said hollow body, as illustrated in FIG. 3 on the basis of the example of the hollow body shown in FIG. 2B. The tilting angle can be for example in a range of approximately 0° to approximately 45°, for example in a range of approximately 0° to approximately 30°, for example in a range of approximately 0° to approximately 15°.

Figure 4:
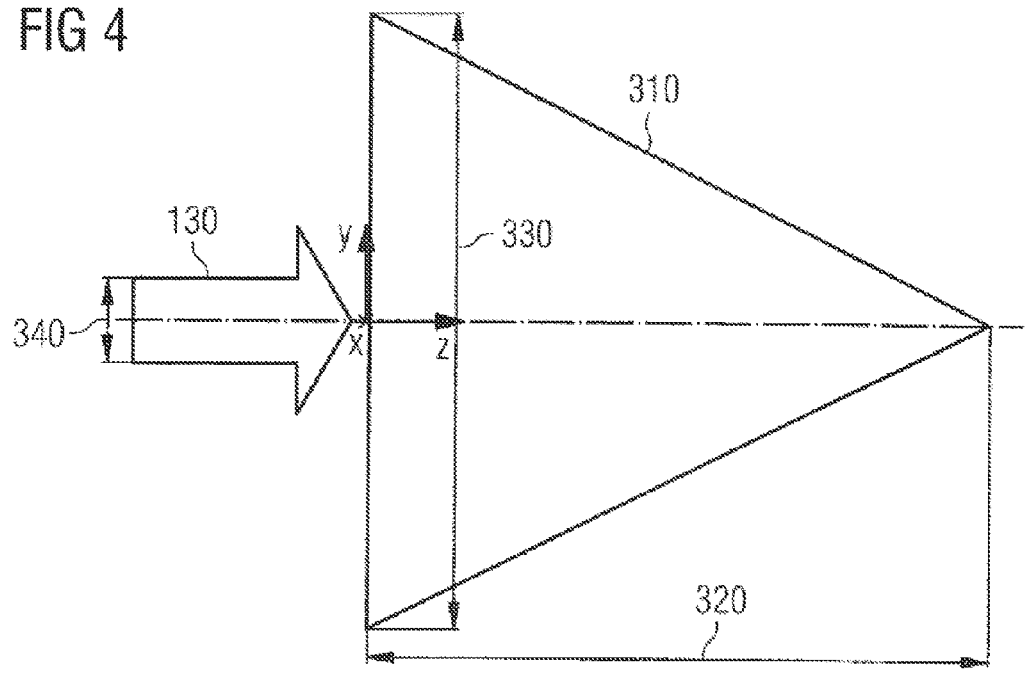
FIG. 4 shows the surface from FIG. 2A in greater detail.

In order to demonstrate the mode of operation of the various exemplary embodiments of the conversion arrangement 120, the light incidence on the exemplary embodiment illustrated in FIG. 2A was simulated. This was done using a corresponding model of the conical hollow body 106, which is illustrated in greater detail in FIG. 4. In this case, the hollow cone 310 has a cone height 320 and a cone diameter 330. Furthermore, the incident pump laser light 130, represented by the arrow 130 in FIG. 4, has a beam diameter 340. Beam diameter 340 and cone height 320 were varied in the simulations carried out. Since the absolute values of the beam diameter 340 and of the cone height 320 were not crucial for the investigations, their respective ratios to the cone diameter 330 were taken as a basis for the following simulation results. They are designated below as relative beam diameter and relative cone height.

A diagram 500 illustrated in FIG. 5 shows the dependence of an aperture angle of a converted light emerging from the conical hollow body, plotted on the y-axis 502, on the relative cone height, plotted on the x-axis 504. In this case, the relative beam diameter was kept constant at 0.5. The aperture angle is defined as that angle which an emerging beam whose intensity falls to half of the maximum value forms with the cone axis (in this case also axis of symmetry). The aperture angle of a Lambertian emitter with a cosinusoidal emission profile is 60°. As can be inferred from the diagram 500, the aperture angle of the arrangement becomes smaller as the cone becomes deeper (see characteristic curve 506 in FIG. 5). The diagram 500 illustrated in FIG. 5 makes it clear that arrangements having a relative cone height of greater than 0.5 limit the aperture angle to a greater extent in comparison with a Lambertian emitter.

A diagram 600 illustrated in FIG. 6 shows the result of the investigation of the influence of the relative beam diameter, plotted on the x-axis 604, on the aperture angle, plotted on the y-axis 602. In this case, the relative cone height was kept constant at 1. The diagram 600 shows that a small beam diameter fosters a small aperture angle (see characteristic curve 606 in FIG. 6).

It should furthermore be mentioned that in the simulations the intensity profile was constant over the cross section of the pump beam. A higher intensity in the center of the beam cross section, as is the case for instance with a Gaussian beam, provides for an even greater constriction of the emerging beams and thus an even smaller aperture angle.

FIG. 7 illustrates the influence of the geometry of a chosen conversion arrangement, in this case the conical hollow body, on the proportion of converted radiation in a diagram 700. As boundary condition, here the relative beam diameter was kept constant at 0.5. The two characteristic curves 706, 708 illustrated in the diagram 700 are based on in each case different initial reflectances of the material that emits light diffusely. The initial reflectance indicates what proportion of the pump light impinging on the surface on which the material that emits light diffusely is arranged is reflected diffusely from said surface. A first characteristic curve 706 represents the profile of the converted radiation given an initial reflectance of 20%. A second characteristic curve 708 represents the profile of the converted radiation given an initial reflectance of 60%. It can be gathered from both characteristic curves 706, 708 that, for rising relative cone heights, the proportion of converted radiation asymptotically approaches a degree of conversion of 100%. Since to an approximation the sum of diffuse reflectance and converted radiation yields 1, accordingly, for increasing relative cone heights, the diffuse reflectance becomes smaller and smaller and asymptotically approaches zero. The cause of this substantive matter can be seen in the fact that in the case of "deep" cones the diffusely reflected pump light does not immediately leave the hollow cone, but rather is incident again on the material that reflects light diffusely on the lateral inner surface 108 of the cone 310 and the conversion probability is thus increased.

Figure 8A:
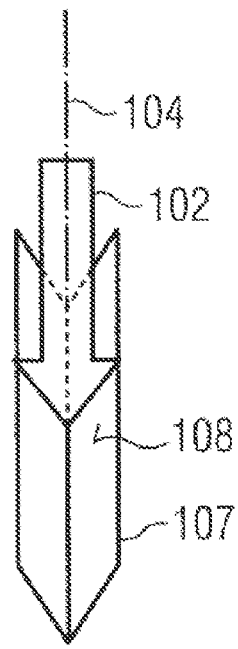
Figure 8B:
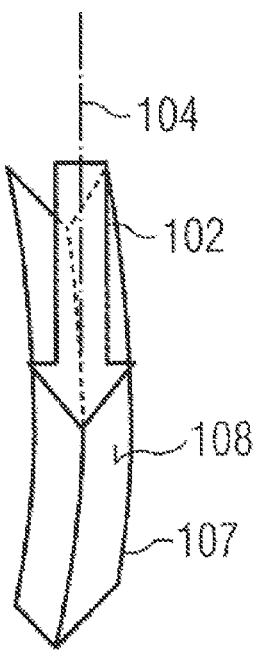

FIG. 8A and FIG. 8B illustrate further exemplary embodiments of the conversion arrangement.

Both figures show "1-dimensional" arrangements since the structure of the surface on which the material that emits light diffusely is arranged is repeated along a line, that is to say in one dimension. By way of example, here the 1-dimensional arrangement is embodied as a groove 107, to whose surface 108 facing the light incidence the material that emits light diffusely is applied. The groove 107 can be straight or curved. In FIG. 8A, the direction of incidence of the pump light 102 lies along the axis 104 of symmetry with respect to the cross section and longitudinal section of the groove 107. In this arrangement, the base surface has a rectangular shape. In FIG. 8B, the direction of incidence of the pump light 102 lies along the axis 104 of symmetry with respect to the cross section of the groove 107. In this arrangement, the base surface has a curved, rectangular shape. In these exemplary embodiments of the conversion arrangement 120, the advantageous setting of the aperture angle of the emerging radiation is effected perpendicular to the arrangement, that is to say along the direction of incidence of the pump light 102 in the opposite direction thereto, and also for example perpendicular to the direction of the significant extent of the arrangement, in this case for example perpendicular to the (in the curved case differential) groove course.

Figure 9A:
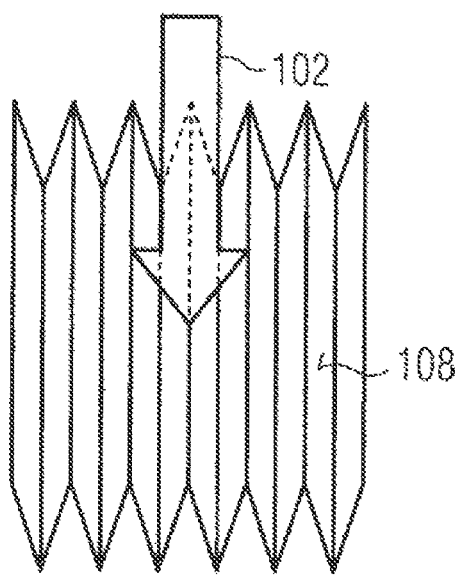
Figure 9B:
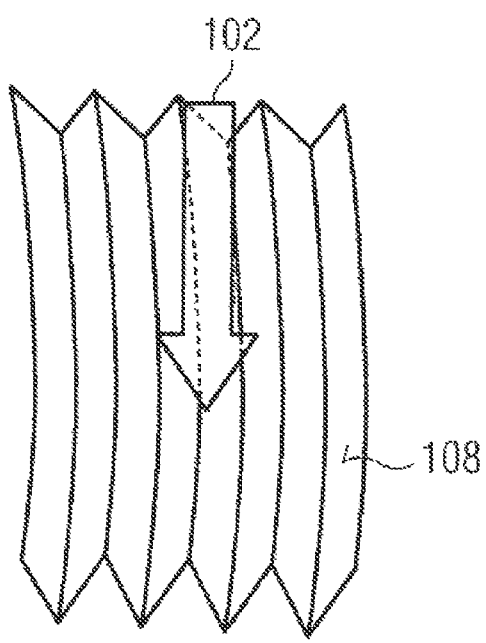

The exemplary embodiments of the conversion arrangement 120 illustrated in FIG. 9A and FIG. 9B arise in each case by juxtaposing the 1-dimensional arrangements illustrated in FIG. 8A and FIG. 8B. The juxtaposition is effected perpendicular to the direction of the significant extent of a respective arrangement. The grooves 107 are therefore positioned laterally alongside one another, wherein an arrangement can have straight grooves, as shown in FIG. 9A, or curved grooves, as shown in FIG. 9B. These exemplary embodiments are particularly suitable if the material that emits light diffusely is intended to be applied to a larger surface of a conversion arrangement 120 and the intention is to take up only little space perpendicular to said surface or to the base surfaces of the arrangements illustrated in FIG. 9A and FIG. 9B. By means of the number of grooves 107 arranged alongside one another, it is possible to control the depth of the conversion arrangement 120 covering a specific surface, i.e. with an increasing number of the individual grooves 107 which are arranged alongside one another and whose base surfaces become smaller and smaller, the depth of the conversion arrangement 120 decreases.

Figure 10A:
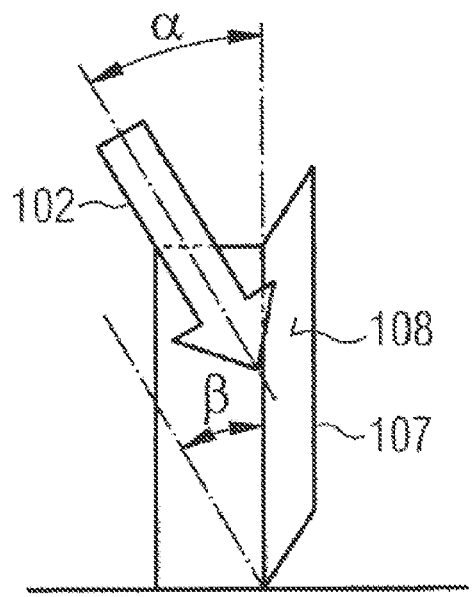
FIGS. 10A and 10B show exemplary embodiments of a surface which emits light diffusely and which is pumped at a predefined angle $\alpha$ in accordance with the embodiments shown in FIG. 8A (FIG. 10A) and FIG. 9A (FIG. 10B)
Figure 10B:
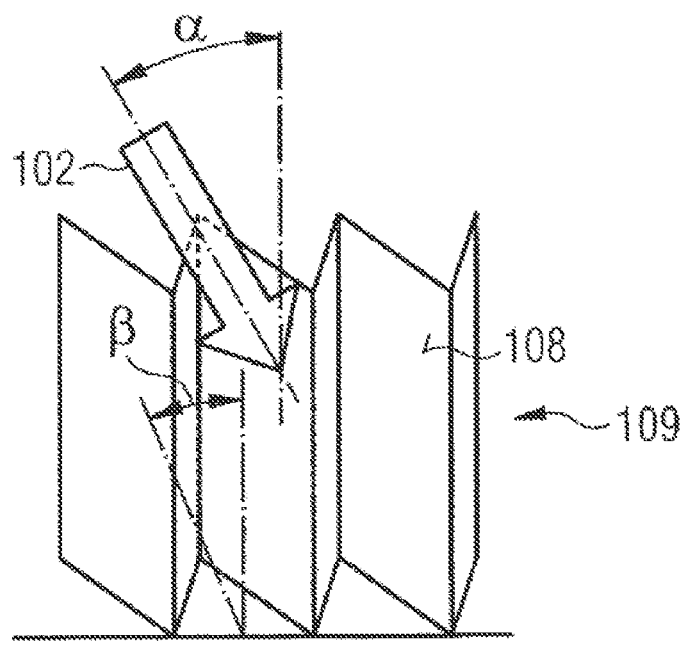

Analogously to the exemplary embodiment of a conversion arrangement illustrated in FIG. 3, also in the exemplary embodiments illustrated in FIG. 8A, FIG. 8B and FIG. 9A, FIG. 9B, the direction of incidence of the pump light 102, as illustrated by way of example in FIG. 10A and FIG. 10B, can be tilted by an angle α, for example in a range of approximately 0° to approximately 45°, for example in a range of approximately 0° to approximately 30°, for example in a range of approximately 0° to approximately 15°, relative to a plane of symmetry of the arrangement. Furthermore, the groove 107 in accordance with FIG. 10A or the conversion arrangement 109 consisting of grooves arranged alongside one another in accordance with FIG. 10B can be tilted in itself by an angle β, such that there is no longer a symmetrical cross section perpendicular to the direction predefined by the groove course. Alternatively, the embodiments in accordance with FIG. 8A, FIG. 8B and FIG. 9A, FIG. 9B can be used with a luminophore wheel.

Figure 11:
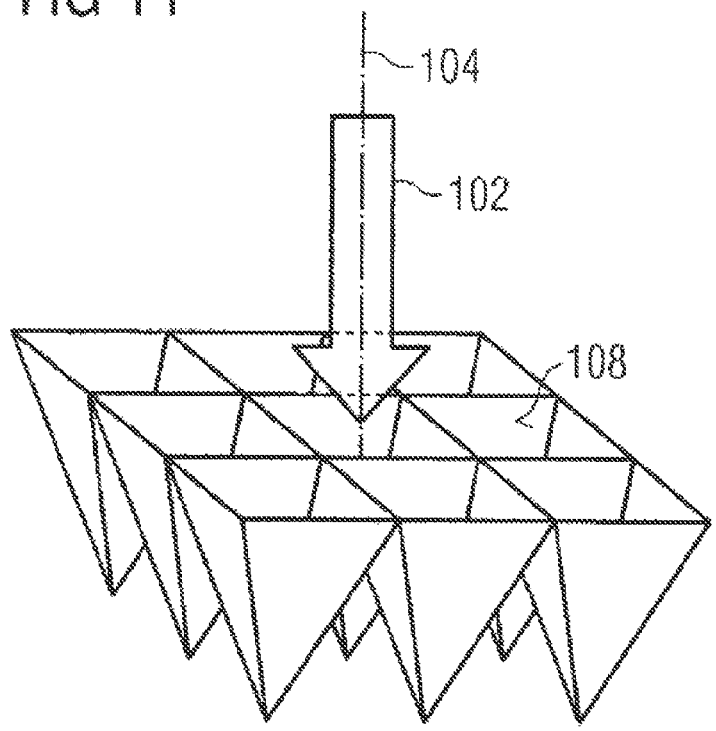
FIG. 11 shows an exemplary embodiment of a surface which emits light diffusely and which is formed by a plurality of lateral surfaces of pyramids.

Besides the embodiments of surface-covering conversion arrangements 130 shown in FIG. 9A and FIG. 9B, a further exemplary embodiment of a surface-covering conversion arrangement 120 is illustrated in FIG. 11. This arrangement is a 2-dimensional arrangement since its structure is repeated along two mutually perpendicular directions. This arrangement is composed of a multiplicity of 0-dimensional hollow bodies 106, to the lateral surfaces 108 of which, on the side facing the pump light incidence 102, the material that emits light diffusely is applied. The hollow bodies 106 can be of pyramidal design in accordance with the embodiment shown in FIG. 2B, i.e. having a square base surface. However, their base surface can also have a different geometrical shape, for example a triangular or hexagonal shape. In this exemplary embodiment of a conversion arrangement 120 as well, the direction of incidence of the pump light 102 can be tilted (not illustrated in the figure) with respect to an (arbitrary, since all parallel) axis 104 of symmetry of the arrangement.

Figure 12:
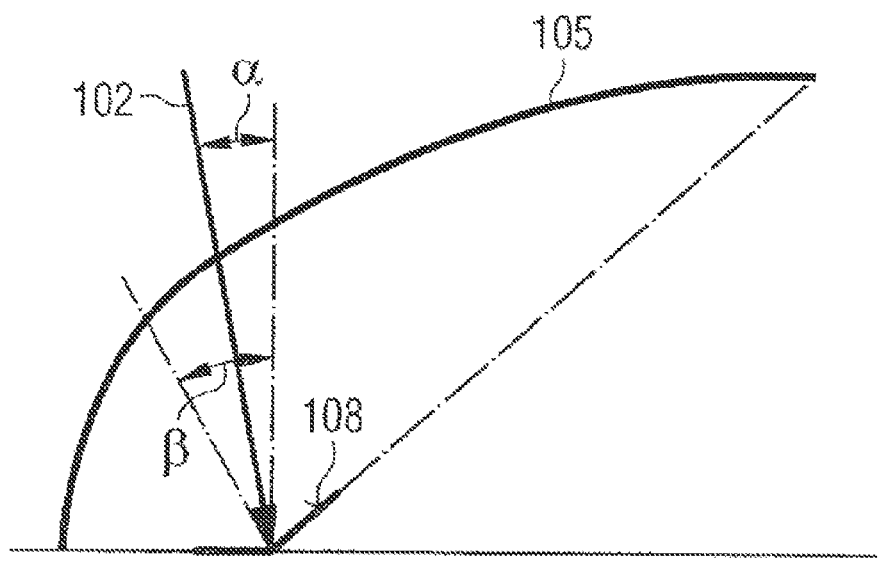
FIG. 12 shows an exemplary embodiment of the illumination arrangement including a reflector.

FIG. 12 illustrates an exemplary embodiment of the illumination arrangement 100, this exemplary embodiment including a reflector 160. The reflector 160 is disposed downstream of the conversion arrangement 120 as an optional element in the schematic construction of the illumination arrangement 100 in FIG. 1. The reflector is designed as a half-shell reflector 105 in the exemplary embodiment illustrated in FIG. 12. The surface of the conversion arrangement 130 on which the light-emitting material is arranged is arranged at least partly at the focal point of the half-shell reflector 105. In this case, α indicates the angle of the direction of incidence of the pump light 102 and β indicates the angle by which the arrangement is tilted. The conversion arrangement 130 used can be any of the exemplary embodiments presented here, but it is not restricted thereto. By virtue of the possibility of setting the aperture angle, in the exemplary embodiment illustrated in accordance with FIG. 12, the geometrical losses from the half-shell reflector 105 can be reduced and the efficiency of the illumination arrangement 100 can thus be increased. Furthermore, this exemplary embodiment can also be used in combination with a luminophore wheel (not shown).

Figure 13A:
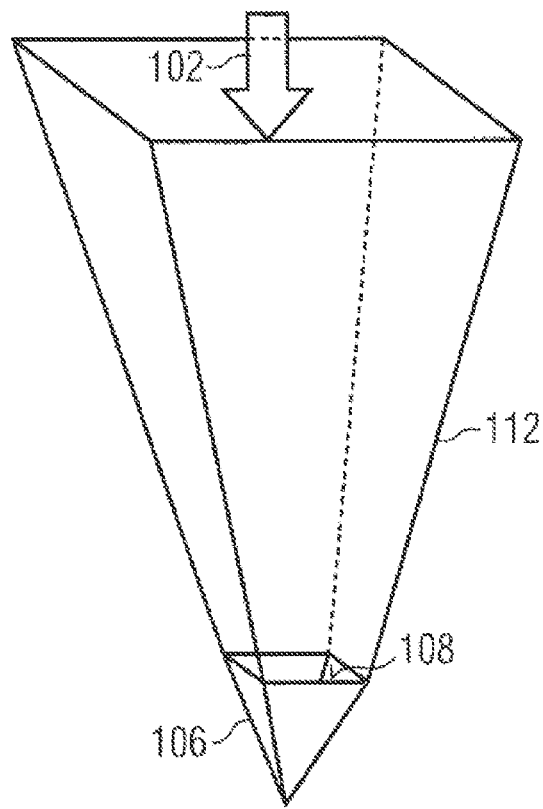
FIGS. 13A and 13B show exemplary embodiments of surfaces which emit light diffusely and which are combined with collimation optical units.
Figure 13B:
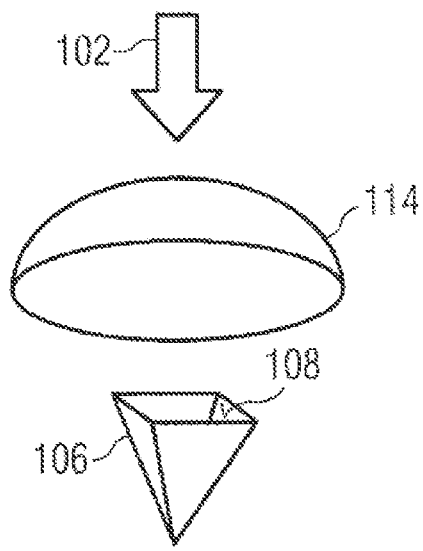

A further possibility for varying the aperture angle of the emitted converted light 140 consists in the use of collimation optical units 150. FIG. 13A and FIG. 13B show exemplary embodiments of collimation optical units 140 in combination with the conversion arrangement 120 shown in FIG. 2B. The pump light incidence 102 takes place from above (as seen from the point of view of FIG. 13A and FIG. 13B) onto the lateral inner surface 108 to which material that emits light diffusely is applied. In FIG. 13A, a TIR element 112 is used, at the walls of which the emerging converted light 140 is subjected to total internal reflection and its aperture angle can thus be varied further. In FIG. 13B, a lens 114 is used for setting the aperture angle. It should be noted that further optical elements such as, for example, lens or collimation optical units can be arranged in the hollow body covered by the material that emits light diffusely, in the interior of said hollow body.

All the exemplary embodiments of the conversion arrangement 120 presented here are based on the common fundamental concept of enlarging that surface of the conversion arrangement 120 which is illuminated by the pump light and to which the material that emits light diffusely is applied, relative to the surface that emits converted light effectively.

This is achieved by the extension of the planar surface to which luminophore is applied in the prior art on surfaces of conversion arrangements 120 which can be formed for example from hollow bodies 106 having different geometries. To put it another way, in the embodiments of the conversion arrangement 120 illustrated here, the surfaces which are essential for the light conversion and on which the material that emits light diffusely is arranged do not extend in a plane lying perpendicular to the pump light incidence and are therefore not restricted to two dimensions relative to the light incidence, but rather extend relative to the light incidence into a third dimension, for example, by virtue of the fact that they are embodied for example as lateral surfaces or surfaces of hollow bodies, which by their nature are three-dimensional.

Since, in the conversion arrangements 120 mentioned here by way of example, their lateral surface or surface is always larger than their base surface, this deliberately engendered decoupling of the surface pumped by the pump light, for example the lateral surface or the surface, from the surface that emits converted light effectively, for example the base surface, results in an advantageous reduction of the power densities on the material that generates light diffusely, and further advantages that have already been described in the course of this application.

The exemplary embodiments presented above of the conversion arrangement 120 which are used in the illumination arrangement are aimed at restricting the aperture angle of the converted radiation emerging from the illumination arrangement.

While the disclosed embodiments has been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An illumination arrangement, comprising:
   a light source for providing laser light; and
   a material being at least one of a diffusely reflective material, a phosphorescent material and a fluorescent material, which is arranged on a surface in the illumination arrangement in such a way that laser light provided by the light source impinges on the material, wherein the surface forms a hollow body having one or more partial surfaces which are arranged in a manner facing one another at least in part in such a way that light reflected or generated by material arranged on one partial surface impinges at least partly on material arranged on the same or another partial surface of the surface, and both the incidence of the laser light on the material and the emission of the reflected or generated light from the material are effected via the same surface of the one or more partial surfaces,
   wherein the surface on which the material being at least one of the reflective, phosphorescent and fluorescent material is arranged defines a groove.

2. The illumination arrangement as claimed in claim 1, wherein the material arranged on the one or the plurality of partial surfaces further comprises a mixture of different luminophore mixtures.

3. The illumination arrangement as claimed in claim 2, wherein one of the luminophore mixtures is an alkali metal silicate phosphor mixture.

4. The illumination arrangement as claimed in claim 1, wherein an aperture angle of the light generated by the illumination arrangement can be set by means of the choice of the angles of the partial surfaces with respect to one another.

5. The illumination arrangement as claimed in claim 1, wherein the surface on which the material being at least one of the reflective, phosphorescent and fluorescent material is arranged forms a lateral surface of a cone or a lateral surface of a pyramid.

6. The illumination arrangement as claimed in claim 1, wherein the groove is embodied as a straight groove.

7. The illumination arrangement as claimed in claim 1, wherein a light path runs parallel to an axis of symmetry of the illumination arrangement.

8. The illumination arrangement as claimed in claim 1, wherein a light path runs in a manner tilted relative to an axis of symmetry of the illumination arrangement.

9. The illumination arrangement as claimed in claim 1, wherein the light source is designed in such a way that the laser light provided comprises more than one laser beams, wherein the laser beams have different wavelengths and their beam paths are independent of one another.

10. The illumination arrangement as claimed in claim 1, furthermore comprising:
    at least one collimation optical unit, designed for restricting an angle at which the light generated by the material leaves the illumination arrangement.

11. The illumination arrangement as claimed in claim 10, wherein the collimation optical unit comprises one of the following elements:
    at least one lens; and
    at least one TIR element.

12. The illumination arrangement as claimed in claim 1, wherein the surface on which the material being at least one of the diffusely reflective material, phosphorescent material and fluorescent material is arranged in the illumination arrangement has a plurality of one or more partial surfaces which are arranged adjacent to one another and are formed on hollow bodies arranged adjacent to one another and are arranged in a manner facing one another at least in part in such a way that light reflected or generated by material arranged on one partial surface of one hollow body impinges at least partly on material arranged on the same or another partial surface of the surface of the same hollow body, and both the incidence of the laser light on the material and the emission of the reflected or generated light from the material are effected via the same surface of the partial surfaces.

13. The illumination arrangement as claimed in claim 1, furthermore comprising:
    a reflector,
    wherein the surface on which the material being at least one of the diffusely reflective, phosphorescent and fluorescent material is arranged is arranged at least partly in the reflector.

14. The illumination arrangement as claimed in claim 1, wherein the illumination arrangement is designed as one of the following illumination arrangements:
    projector lamp;
    effect lighting lamp; and
    lamp in the area of optical waveguides.

15. The illumination arrangement as claimed in claim 1, wherein the groove is embodied as a curved groove.

16. An illumination arrangement, comprising:
    a light source for providing laser light;
    a material being at least one of a diffusely reflective material, a phosphorescent material and a fluorescent material, which is arranged on a surface in the illumination arrangement in such a way that laser light provided by the light source impinges on the material, wherein the surface forms a hollow body having one or more partial surfaces which are arranged in a manner facing one another at least in part in such a way that light reflected or generated by material arranged on one partial surface impinges at least partly on material arranged on the same or another partial surface of the surface, and both the incidence of the laser light on the material and the emission of the reflected or generated light from the material are effected via the same surface of the one or more partial surfaces; and a reflector, wherein the surface on which the material being at least one of the diffusely reflective, phosphorescent and fluorescent material is arranged is arranged at least partly at the focal point of the reflector.

\* \* \* \* \*